United States Patent [19]

Noji

[11] Patent Number: 4,569,000
[45] Date of Patent: Feb. 4, 1986

[54] MOUNTING STRUCTURE FOR ELECTRIC ELEMENTS

[75] Inventor: Tasuku Noji, Soma, Japan

[73] Assignee: Alps Electric Co., Ltd., Japan

[21] Appl. No.: 430,997

[22] Filed: Sep. 30, 1982

[30] Foreign Application Priority Data

Nov. 13, 1981 [JP] Japan .................. 56-169143[U]

[51] Int. Cl.[4] .......................................... H05K 3/34
[52] U.S. Cl. ............................... 361/394; 174/52 R;
361/399; 361/419; 361/420
[58] Field of Search .......... 174/35 R, 35 MS, 35 GC,
174/52 FP, 52 R; 361/399, 424, 394, 421, 420

[56] References Cited

U.S. PATENT DOCUMENTS

| | | | |
|---|---|---|---|
| 1,661,535 | 3/1928 | Haddock | 174/35 R X |
| 2,777,893 | 1/1957 | De Rosso | 174/52 R |
| 2,786,969 | 3/1957 | Blitz | 174/52 R X |
| 3,239,719 | 3/1966 | Shower | 361/394 X |
| 3,407,261 | 10/1968 | Donath et al. | 361/424 X |
| 3,469,684 | 9/1969 | Keady et al. | 361/421 X |
| 3,586,917 | 6/1971 | Oates | 361/394 X |
| 3,644,848 | 2/1982 | Kruczek | 330/70 |
| 3,715,635 | 2/1973 | Michel et al. | 174/52 FP X |
| 3,721,746 | 3/1973 | Knappenberger | 174/35 MS |
| 3,846,734 | 11/1974 | Pauza et al. | 339/17 |
| 4,089,041 | 5/1978 | Lockard | 174/52 FP X |
| 4,167,647 | 9/1979 | Salera | 174/52 FP |
| 4,227,094 | 10/1980 | Semur | 361/394 X |
| 4,370,515 | 1/1983 | Donaldson | 174/35 |
| 4,370,700 | 1/1983 | Duddles et al. | 361/399 X |
| 4,404,617 | 9/1983 | Ohyama | 174/35 R X |

Primary Examiner—R. R. Kucia
Attorney, Agent, or Firm—Guy W. Shoup; Gerrard F. Dunne

[57] ABSTRACT

Disclosed is a mounting structure for electric elements in circuit blocks of an electric circuit, particularly suitable for an ultrahigh-frequency circuit, allowing such elements to be automatically mounted as well as soldered, by such a way that holding parts with configurations and dimensions compatible with terminal parts of the elements are provided at portions of metal pieces as wiring conductors respectively, which are embedded in a frame made of an insulator at a proper distance, and the elements are mounted and secured so that the terminals thereof are positioned on the holding parts of the metal pieces.

6 Claims, 12 Drawing Figures

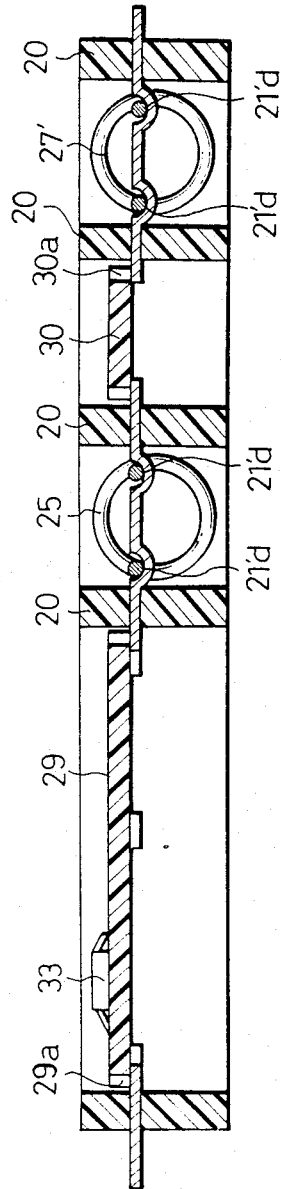
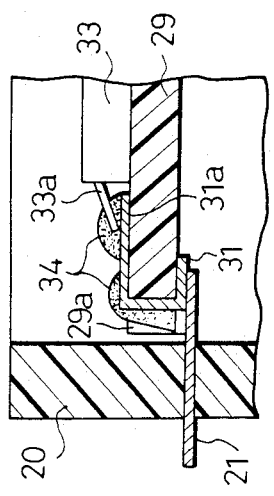
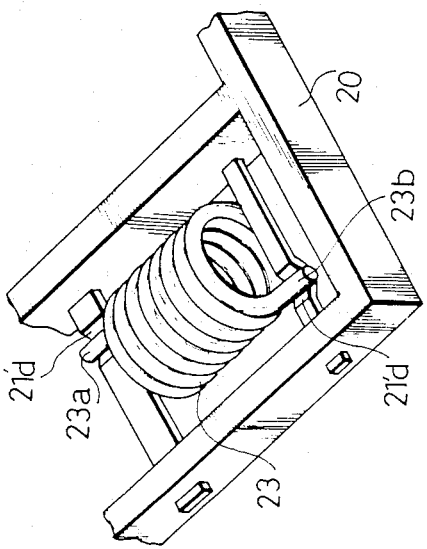

MOUNTING STRUCTURE FOR ELECTRIC ELEMENTS

BACKGROUND OF THE INVENTION

1. Field of the Invention

The present invention relates to a mounting structure for electric elements in circuit blocks of an electric circuit, and particularly a mounting structure suitable for an ultrahigh-frequency circuit.

2. Description of the Prior Art

A typical conventional converter for converting an electric wave in a UHF band into one in a VHF band includes a metallic shielding case having a plurality of small chambers formed by partitioning the inside of the case by shielding plates, and circuit boards incorporating such electric components as capacitors, resistors, transistors and the like are housed in these small chambers. The electric components are electrically interconnected through connection terminals penetrating through the shielding plates, or electrically connected with the outside through terminals penetrating through the case. In addition, in some cases, a coil is directly soldered to terminals provided in a small chamber without use of any circuit board in order to prevent the quality factor or Q from lowering, or for some other reasons. Additionally, the circuit boards are often mounted to the case by securing terminals extending between the circuit boards and the metal case or the shielding plates by means of soldering or by directtly screwing these terminals to the case.

The conventional converters as described above have such disadvantages that the soldered terminals or parts screwed in place for mounting the circuit boards and the coil must often be manipulated manually and, consequently, not only is such operation difficult, but the cost of production becomes high.

SUMMARY OF THE INVENTION

It is, therefore, an object of the present invention to provide a mounting structure for electric components of a high-frequency electric circuit device, wherein such components can be automatically mounted and soldered in place, thereby improving the soldering operation which must be manually performed in the prior art.

BRIEF DESCRIPTION OF THE DRAWINGS

FIG. 7 is a sectional view taken along a line B—B' of FIG. 6;

FIG. 8 is a partial perspective view of the circuit block frame on which an electric element is being mounted;

FIGS. 9 and 10 are partially sectional views of a circuit board and the frame in an interconnected state respectively;

DETAILED DESCRIPTION OF THE PREFERRED EMBODIMENT

A preferred embodiment of the present invention will be described hereinunder in greater detail with reference to the accompanying drawings.

Figure 1:
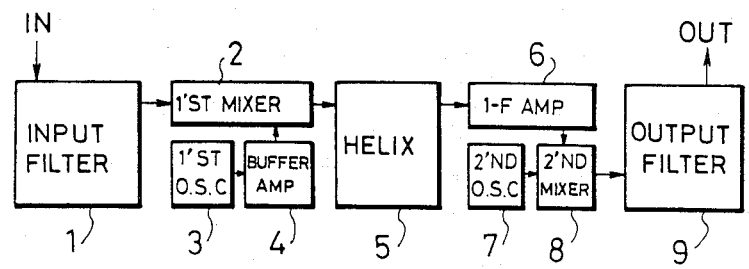
FIG. 1 shows a block circuit diagram of a CATV converter.

FIG. 1 shows a block diagram of the CATV converter. The CATV converter, which takes out only a desired signal from input high-frequency signals and converts it into an intermediate-frequency signal to be delivered, adopts a double converter system comprising two mixers formed by a first mixer 2 and a second mixer 8, as shown in FIG. 1. In operation, high-frequency signals fed from an input terminal IN are passed through an input filter 1 to remove undesired signals and then fed to the first mixer 2. A first local oscillator 3, which is a variable-frequency local oscillator, transmits a local signal for a desired channel, which is amplified by a buffer amplifier 4 and fed to the first mixer 2. The first mixer 2 converts the input signal into a first intermediate frequency signal for the desired channel. The first intermediate-frequency signal is passed through an intermediate-frequency signal filter formed by a helical filter 5 and amplified by an IF amplifier 6 in the subsequent stage before being fed to the second mixer 8. At the same time, a second local oscillator 7 feeds a local signal having a natural frequency to the second mixer 8 in order to convert the first intermediate-frequency signal into a signal equal to, e.g., an unused channel of a TV. Thereby, the second intermediate-frequency signal generated in the second mixer 8 is passed through an output filter 9 in the subsequent stage, and only the signal for the unused TV is delivered as an output signal.

Figure 2:
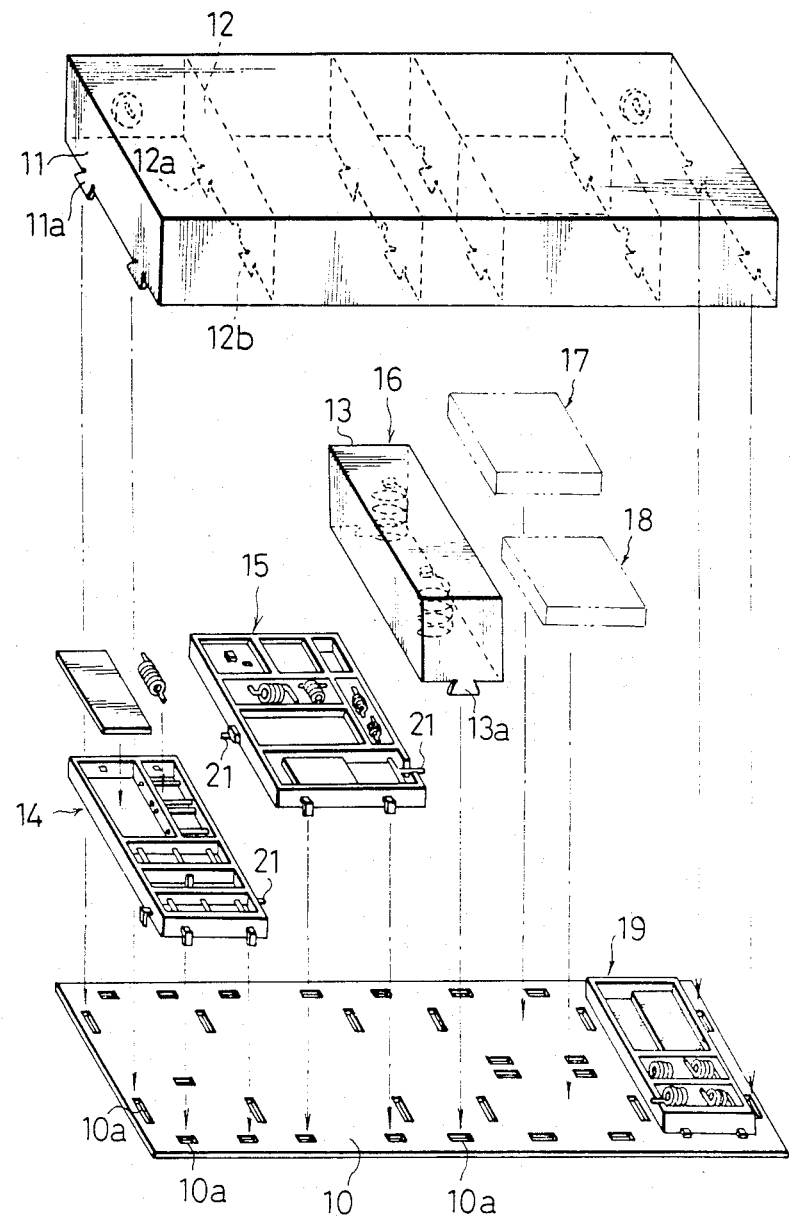
FIG. 2 is an exploded perspective view illustrating an assembly structure of a high-frequency circuit to which the present invention is pertained.
Figure 4:
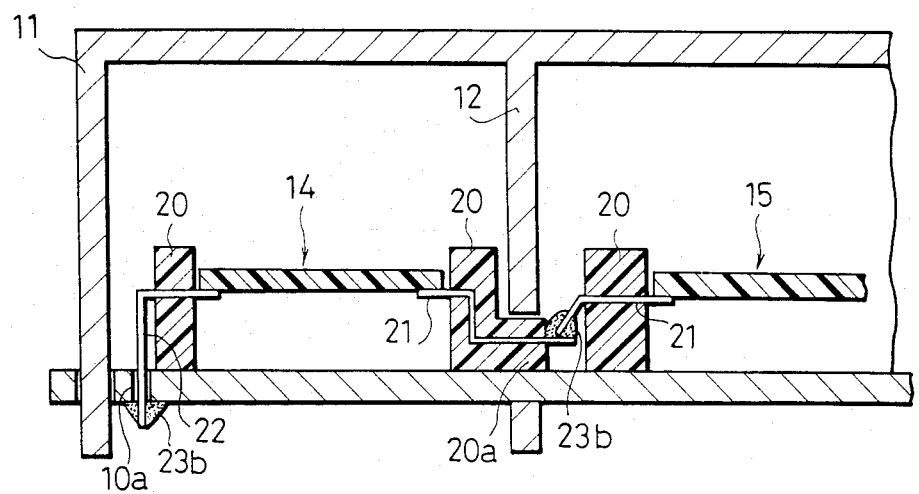
FIG. 4 is an enlarged partially sectional view of FIG. 3, particularly showing circuit blocks in an interconnected state.

FIG. 2 is an exploded perspective view illustrating an assembly structure of the above-mentioned converter circuit. In the figure, a metal bottom plate 10 has openings 10a for receiving calking tabs 11a of a metal frame 11, a calking tabs 12a of shielding plates 12 and a calking tabs 13a of a box-shaped metal shielding case 13. The frame 11, which has a box shape, is partitioned into small chambers by a plurality of shielding plates 12. Circuit blocks 14, 15, 16, 17, 18 and 19 form the input filter 1, the first mixer 2, the first local oscillator 3 and the like of FIG. 1. After the circuit blocks 14, 15, 16, 17, 18 and 19 are mounted on the bottom plate 10, the calking tabs 11a of the frame 11 and the calking tabs 12a of the shielding plate 12 are inserted into the openings and calked to complete assembly.

Figure 3:
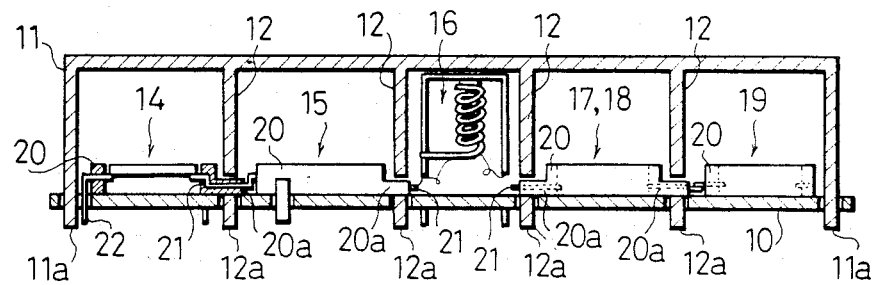
FIG. 3 is a sectional view of the assembly structure.
Figure 5:
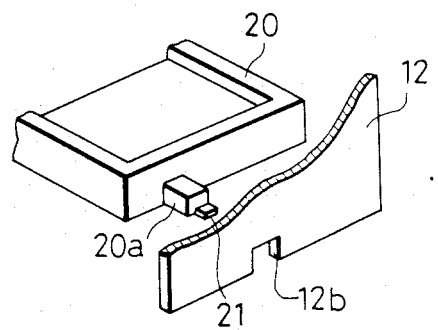
FIG. 5 is a partial perspective view of a circuit block molded frame projection and a shielding plate according to the present invention in an engaged state.

FIG. 3 is a sectional view of a completed circuit structure assembled as described above. In the figure, a reference numeral 20 designates a molded frame for each of the circuit blocks for forming a desired partition inside each circuit block, the frame being formed by molding synthetic resin or the like. The frame 20 for the block 14 has a projection 20a integrally formed at the output end part therof, and the metal frames for the blocks 15, 17 and 19 each has a similar projection 20a at its input and output end poarts. The frame 20 for the block 19 has a similar projection 20aw at its input, as shown in FIG. 3. A metal piece 21 serving as a connection conductor for connecting adjacent circuit blocks with each other is embedded and secured in the respective projections 20a. As shown in FIG. 5, the projections 20a of the molded frame 20 are fitted into a respective rectangular notches 12b formed in the lower side of the shielding plates 20. The adjacent circuit blocks are disposed so that the metal piece 21 outwardly projecting from the molded frame 20 of one circuit block is positioned on the metal piece 21 outwardly projecting from the projection 20a of the molded frame 20 of the other circuit block, and the contact portions of the metal pieces 21 are fixedly connected with each other by a soldered bead 23b. A grounding terminal 22 of the circuit block 14 is embedded and secured in the molded frame 20 and downwardly bent outside the frame 20. The grounding terminal 22 is inserted into one of the openings 10a formed in the bottom plate 10, and secured by solder 23b at the lower end of the terminal 22. Connecting operations between other circuit blocks 17 and 18 and between the circuit blocks 18 and 19 and so forth are substantially simultaneously performed.

The method of embedding and securing the metal piece 21 serving as a connecting conductor and the metal piece 21' serving as a wiring conductor for components within the same block (see FIG. 6) in the molded frame 20 will be described hereinunder. A metal plate is punched by means of a press to form patterns for the connecting conductor and the wiring conductor, and after the frame 20 is formed by molding an insulating material such as synthetic resin or the like over the connecting and wiring conductor patterns, portions unnecessary for the connecting conductor and the wiring conductor are removed. In this way, the metal piece 21 and the metal piece 21' are embedded and secured in the molded frame 20.

Figure 6:
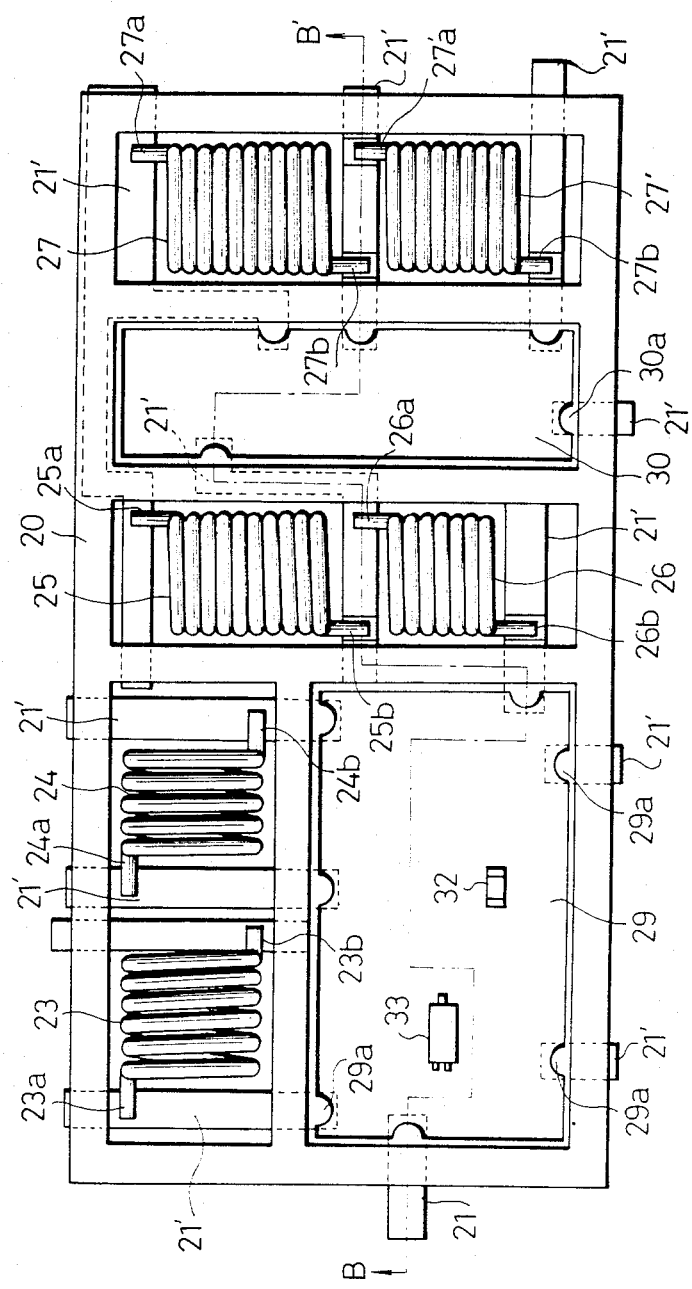
FIG. 6 is a plan view of a circuit block frame according to present invention on which various electric elements are being mounted.
Figure 10:
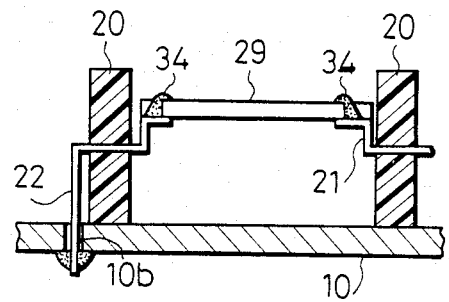

A practical structure of the circuit blocks will be described hereinunder. FIG. 6 is a plan view showing a state before various electric components mounted on the molded frame 20 are soldered. In the figure, reference numerals 23–27 and 27' designate air-core coils, respectively. At respective ends of the respective coils, terminals 23a,b–27a,b and 27'a,b are provided, and each of the terminals of the coils is mounted on the metal piece 21' serving as a wiring conductor. The part of the metal piece 21' receiving the coil terminal has substantially semicircular recesses 21'd as shown in FIG. 7 and FIG. 8. It is necessary to provide the dimensions of the recess 21'd large enough to absorb errors in positioning the coil terminals because the position of the coil terminals is not uniform due to variance in the manufacture of the coils. In addition, it is possible to mount the coil 23 in such a manner that the coil terminals 23a, 23b are dropped, without any special attention, so as to be positioned automatically in the recesses 21'd as shown in FIG. 8. Circuit boards 29 and 30 for a high-frequency circuit, made of ceramic plate, are mounted on the respective metal pieces 21'. Although not shown for preventing the figure from becoming complicated, a wiring circuit with a desired pattern is provided on the surface of each of the circuit boards notches 29a, 30a formed in the peripheral parts thereof respectively. As shown clearly in FIG. 9, the notches 29a and 30a are coated with a metal film 31 to provide a mounting terminal part 31a, which is electrically connected with the wiring circuit of each of the circuit boards 29, 30. Reference numerals 32 and 33 denote electric components such as transistors, capacitors, resistors and the like, mounted on the circuit board 29, and the terminals of such components are mounted on the wiring circuit provided on the circuit board 29. FIG. 10 is a partially sectional view showing a state where the circuit board 29 is mounted and soldered on both the metal piece 21 for connection between the adjacent circuit blocks and the grounding terminal metal piece 22 which are embedded and secured in the circuit block molded frame 20.

Figure 11:
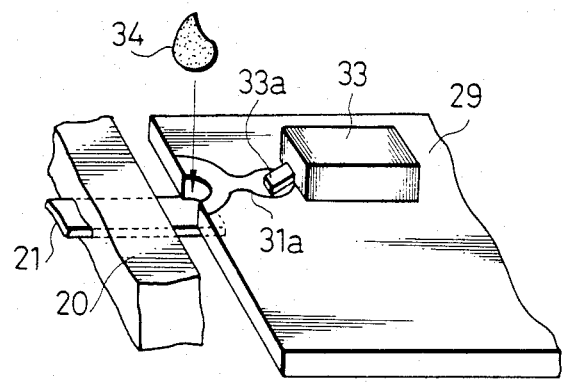
FIG. 11 is a partial perspective view of the circuit board and the frame in an interconnected state.
Figure 12:
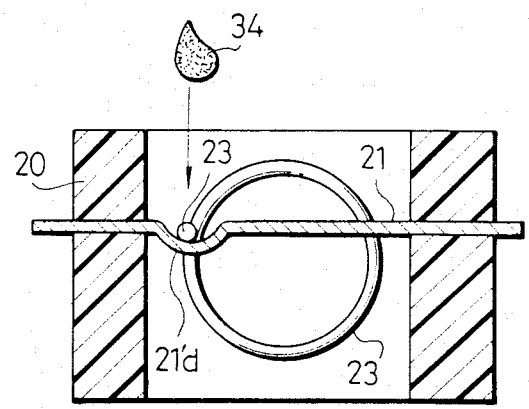
FIG. 12 is a partially sectional view of the circuit board and the frame in an interconnected state.

The mounting operation of the coils onto the molded frame 20, that of the parts onto the circuit board, and that of the circuit board onto the molded frame 20 are performed as follows. As shown in FIG. 6 and FIG. 12, the terminals 23a, 23b of the coil 23 are mounted on the recesses 21'd, 21'd of the metal piece 21' respectively, and reflow solder 34 formed by mixing paste and solder powder with each other is dropped so as to attach to the contact part between the coil terminal 23a and the recess 21'd. Also, the reflow solder 34 is dropped so as to attach to the mounting terminal part 31a of the circuit board 29 as shown in FIG. 11, and although not shown, the reflow solder 34 is also dropped on the contact part between a terminal 33a of the electric elements 33 and the wiring circuit 31a. FIG. 9 is a sectional view showing a state where the reflow solder 34 is attached. After the reflow solder 34 is thus attached, the circuit blocks are heated in an electric oven in order to fuse the reflow solder 34 and then cooled in order to harden the solder, thereby to allow each of the electric components to be secured to the molded frame 20 to complete each of the circuit blocks. Accordingly, there is provided such an effect that the electric components can be automatically furnished on the molded frame, by thus dropping the reflow solder so as to attach to the contact part between each of the terminals of such electric components as coils and the like and each of the holding parts of the metal pieces and then by fusing the reflow solder by heating in the electric oven thereby to secure such electric parts.

As will be fully understood from the foregoing description, according to the present invention, since holding parts with the configuration and dimensions compatible with the terminal part of electric elements are provided at portions of the metal pieces serving as wiring conductor, and the metal pieces are embedded in the frame made of an insulator at a proper distance, and then the electric elements are mounted and secured so that the terminals thereof are positioned on the holding parts of the metal pieces, assembly operations, particularly the mounting operation of coils, become easy, and the operation process can be largely simplified and since the configuration and dimensions of the holding parts are made compatible with the terminals of the electric components there is less variation in positioning electric elements, particularly coils, so that performance is stabilized. Moreover, it is possible to provide a mounting structure for electric components which permits an automatic machine to mount the electric components relatively easily.

What is claimed is:

1. In an apparatus for processing high-frequency signals by a plurality of electric components grouped into separate circuit blocks each housed respectively in a shielded compartment, including a base plate for receiving each of said circuit blocks, and a housing member secured to said base plate and divided into a plurality of said compartments by upstanding shield plates, the improvement wherein said circuit blocks are each formed by a frame molded from an insulating material and having embedded therein conductive portions for connecting the electric components of said circuit block electrically together, said conductive elements having means exposed from said frame for receiving terminal portions of the electric components to hold them in position prior to soldering of said terminal portions to said exposed portions.

2. In an apparatus according to claim 1, said means being formed by semicircular recesses being formed in said exposed portions and adapted to receive respective terminal portions of said electric components.

3. In an apparatus according to claim 2, said recesses each being larger than the respective terminal portion.

4. In an apparatus for processing high frequency signals by a plurality of electric components grouped into separate circuit blocks each housed respectively in a shielded compartment, including a base plate for receiving each of said circuit blocks, and a housing member secured to said base plate and divided into a plurality of said compartments by upstanding shield plates, the improvement wherein at least some of said circuit blocks include a coil as the electric component and are formed by a respective frame molded from an insulating material and have embedded therein conductive portions for connecting the electric components for said circuit block electrically together, said conductive elements having means exposed from said frame for receiving terminal portions of said coils to hold them in position prior to soldering of said terminal portions to said exposed portions.

5. In an apparatus according to claim 4, said means being formed by semicircular recesses being formed in said exposed portions and adapted to receive respective terminal portions of said coils.

6. In a apparatus according to claim 5, said recesses each being larger than the respective terminal portion.

* * * * *